United States Patent [19]

Erb et al.

[11] Patent Number: 4,650,544
[45] Date of Patent: Mar. 17, 1987

[54] SHALLOW GROOVE CAPACITOR FABRICATION METHOD

[75] Inventors: Darrell M. Erb, Los Altos; Asim A. Selcuk, Santa Clara, both of Calif.

[73] Assignee: Advanced Micro Devices, Inc., Sunnyvale, Calif.

[21] Appl. No.: 725,047

[22] Filed: Apr. 19, 1985

[51] Int. Cl.$^4$ .................. H01L 21/306; B44C 1/22; C03C 15/00; C23F 1/02
[52] U.S. Cl. .................. 156/653; 29/576 W; 29/580; 156/648; 156/657; 156/661.1; 156/662; 357/51; 357/59; 357/65
[58] Field of Search .............. 156/643, 648, 649, 653, 156/657, 659.1, 661.1, 662; 29/576 W, 580; 357/47, 48, 49, 50, 51, 59, 65; 427/93, 94, 86, 88

[56] References Cited

U.S. PATENT DOCUMENTS

| | | | |
|---|---|---|---|
| 4,017,885 | 4/1977 | Kendall et al. | 156/648 X |
| 4,449,287 | 5/1984 | Maas et al. | 156/648 X |
| 4,476,623 | 10/1984 | El-Kareh | 156/649 X |
| 4,478,655 | 10/1984 | Nagakubo et al. | 156/648 X |

OTHER PUBLICATIONS

Sunami et al., "A Corrugated Capacitor Cell (CCC)," *IEEE Transactions on Electron Devices*, vol. ED-31, No. 6, Jun. 1984.

*Primary Examiner*—William A. Powell
*Attorney, Agent, or Firm*—Eugene H. Valet; Patrick T. King

[57] ABSTRACT

A shallow capacitor cell is formed by using conventional integrated circuit processes to build a substrate mask having sublithographic dimensions. Multiple grooves, or trenches, are etched into the substrate using this mask. The capacitor dielectric layer and plate are then formed in the grooves.

18 Claims, 11 Drawing Figures

SHALLOW GROOVE CAPACITOR FABRICATION METHOD

BACKGROUND OF THE INVENTION

1. Field of the Invention

The present invention generally relates to integrated circuit capacitor components and, in particular, to a method of fabricating a shallow capacitor cell having multiple grooves, particularly useful for dynamic random access memory (DRAM) integrated circuits.

2. Description of the Related Art

Computer memory integrated circuits often use random access memory (RAM) components because of their versatility and the high density of memory cells which can be achieved, particularly in metal-oxide semiconductor (MOS) die. Basically, a cell for storing a bit of digital data uses a single transistor and a storage capacitor. The digital information is held as a charge on the capacitor and is addressed through the transistor. An array of such cells are connected by bit lines and word lines accessed via an address decoder.

Capacitor data storage suffers from charge loss due to leakage currents. Therefore, all the storage capacitors in the array are occasionally refreshed to drive the capacitors back to a full logic level representing a stored bit of data; hence, the derivation of the name "dynamic RAM" or DRAM.

A major operational problem of the DRAM is known as the "soft failure," i.e., the spontaneous flipping of a memory bit while the integrated circuit basically is operating properly. It has been found that this phenomena is attributable to random alpha particles (helium nuclei). Alpha particles can come from cosmic rays reacting with the silicon of the die. It has also been discovered that the alpha particles are often generated by the integrated circuit package materials. The traveling particles have an ionization wake which leaves behind a trail of electronhole pairs in the die. The holes, if in proximity to a storage capacitor, can result in a charge loss sufficient to cause a soft failure. Whatever the source, the alpha particles are known to generate an upset charge as they travel through the die which may cause any cell in their general path to fail.

Several proposals have been offered as solutions to the soft failure problem. Covering the die surface with a silicone protecting material provides some reduction. Another technique is to increase the capacitor size to accommodate any such charge loss or gain occasioned by the incursion of an alpha particle ($10^6$ electrons).

One type of structure to increase efficiently the storage capacity is proposed by Sunami, et al, "A Corrugated Capacitor Cell (CCC)," as published in the *IEEE Transactions on Electron Devices*, Vol. ED-31, No. 6, June 1984, pp. 746-753. Sunami, et al, proposes the use of a deep trench etched several microns into the silicon substrate. Storage capacitance is increased by forming the capacitor plate on the side walls of the trench in addition to the planar surface of the substrate. As cell density increases, however, the trench must be made deeper to give the same required storage capacitance. This, in turn, causes manufacturing problems due to the depth of silicon that must be etched. Additionally, it becomes difficult to put DRAM cells in complementary metal-oxide semiconductor (CMOS) wells because the capacitor grooves would penetrate through wells which are processable generally to about 4 microns deep. DRAMs in CMOS wells are more resistant to alpha particle induced soft errors. Therefore, there is a benefit to making a shallow capacitor that can fit in a CMOS well.

With respect to DRAM devices, standard 16-pin integrated circuit packing approaches maximum density at the 256k size. Hence, there is a need in the integrated circuit field for improved storage capacitor structures, particularly for increasing capacitance without increasing overall physical size.

SUMMARY OF THE INVENTION

It is a principal object of the present invention to provide a method for fabricating an improved integrated circuit capacitor structure.

It is another object of the present invention to provide a method for fabricating an integrated circuit capacitor which is particularly useful for DRAM devices.

It is a further object of the present invention to provide a method for fabricating an integrated circuit capacitor cell having sublithographic device geometries.

It is also an object of the present invention to construct a capacitor cell that is shallow enough for use in a CMOS well.

In its broad aspect, the present invention provides a method of fabricating a groove capacitor in an integrated circuit substrate. A layer of masking or material is formed on the substrate with a hole in said layer down to the substrate planar surface. Pillar(s) of a masking material are built in said hole on said substrate. The masking material thusly forms a mask which is then used to etch grooves, or trenches, in the substrate. The mask is removed and the capacitor is formed by conformally depositing or growing a thin insulator layer on the substrate, followed by filling the grooves with a conductive material. This results in a shallow capacitor cell structure having multiple grooves.

Other objects, features, and advantages of the present invention will become apparent upon consideration of the following detailed description and the accompanying drawings, in which like reference designations represent like features through the Figures.

BRIEF DESCRIPTION OF THE DRAWINGS

FIGS. 1 through 8 are cross-sectional schematic drawings of an idealized sequence of process steps according to the present invention in which:

FIG. 1 shows step completion of a substrate having an apertured masking layer;

FIG. 2 shows step completion wherein a second masking layer has been formed;

FIG. 3 shows step completion wherein regions of the second masking layer have been removed;

FIG. 4 shows step completion wherein a third masking layer has been formed;

FIG. 5 shows step completion wherein regions of the third masking layer have been removed;

FIG. 6 shows step completion wherein the remaining sections of the second masking layer have been removed;

FIG. 7 shows step completion wherein the remaining sections of the first and third layers have been used as a mask and grooves have been formed in the substrate;

FIG. 8 shows step completion wherein a thin insulation layer and a conductive material layer on the thin insulation layer have been formed to construct the capacitor cell structure;

DETAILED DESCRIPTION OF THE INVENTION

Reference is now made in detail to a specific embodiment of the present invention, which illustrates the best mode presently contemplated by the inventors for practicing the invention. Alternative embodiments are also briefly described. The drawings referred to in this description should be understood not to be drawn to scale except where specifically noted. Moreover, the drawings are intended to illustrate only one portion of an integrated circuit fabricated in accordance with the present invention.

The process of the present invention begins with a silicon wafer which defines a silicon substrate 10 for the integrated circuit(s) being fabricated, for example, a DRAM. Such wafers are commercially available. The details of common techniques used in the fabrication process of the present invention are well known in the art. Many classical texts publish such details and, hence, they are omitted herein; see, e.g., *Semiconductor & Integrated Circuit Fabrication Techniques*, Reston Publishing Company, Inc., copyright 1979 by the Fairchild Corporation. Moreover, individual steps can be performed using commercially available integrated circuit fabrication machines. Approximate ranges have been specified throughout based upon current technology; future developments in this art may call for appropriate adjustments as also would be obvious to one skilled in the art.

Figure 1:
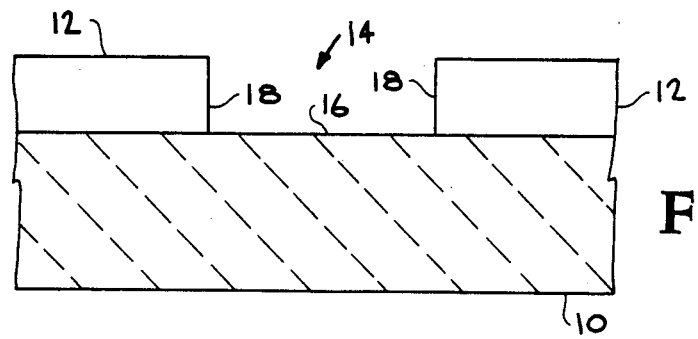

FIG. 1 shows the substrate 10 at the completion of several steps of the method of the present invention. A masking layer 12 has been formed, such as by thermal oxidation of the substrate 10 in an oxidizing atmosphere at an elevated temperature to form a silicon dioxide layer, or by chemical vapor deposition processes. A typical thickness range for this silicon dioxide layer 12 is approximtely one to four microns. As will become apparent from later steps of the process, the thickness, or height, of this masking layer 12 is essentially determined by etching rates of the chemical of choice of the practioner and the desired depth of the capacitor to be achieved.

An aperture 14 is made, such as by known photoresist etching, in the layer 12 at each position on the substrate surface 16 where a capacitor is to be formed in the substrate 10. The photoresist mask (not shown) used to do the etching is then removed. For clarity of description, the remaining process steps will be discussed in terms of fabricating one capacitor cell. It is to be understood that, in actual manufacturing, an array of such cells may actually be formed.

Figure 2:
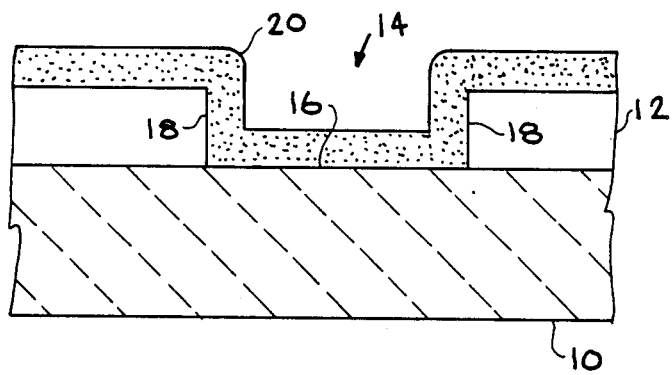
Figure 3:
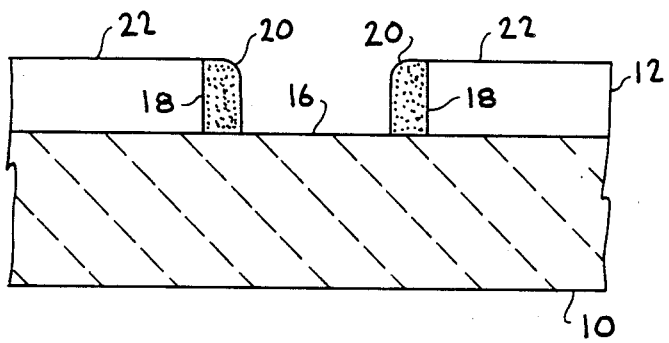

A second masking layer 20, as shown in FIG. 2, is formed conformally over the oxide layer 12 and the exposed silicon substrate surface 16. This second masking layer 20 must have generally different etching properties than said first layer 12. It has been found that silicon nitride has the appropriate properties. Again, as with further layer formation and removal, common techniques such as CVD can be employed. The nitride is deposited to a thickness in the range of approximately 500 to 8000 Angstroms. Next, the nitride layer 20 is anisotropically etched until it clears from the flat silicon dioxide layer surface 22 and the substrate surface 16. Step completion is shown in FIG. 3.

Figure 4:
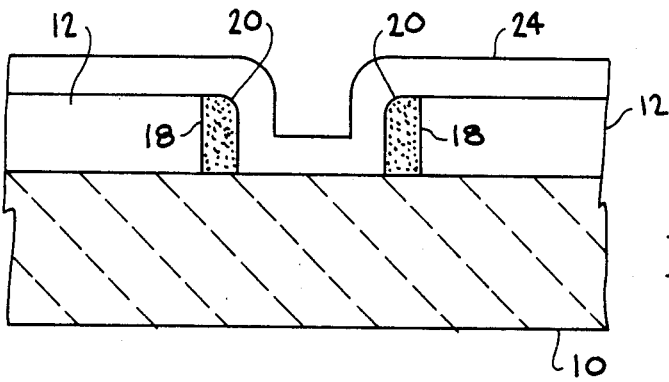

Referring now to FIG. 4, a third masking layer 24 having the same properties as the first, i.e., silicon dioxide, is formed conformally over the structure. The thickness is approximately 2000 Angstroms; a range of approximately 500 to 8000 Angstroms is appropriate.

Figure 5:
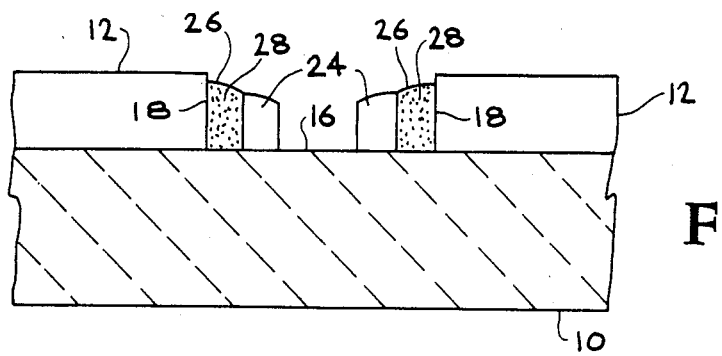

Anisotropic etching is performed until the third layer 24 is cleared from the flat silicon dioxide layer surface 22 and the substrate surface 16 and from the top surface 26 of the nitride 20. As can be seen in FIG. 5, only filaments 28 of nitride remain, separating the first silicon dioxide layer 12 sidewalls 18 from the pillars of silicon dioxide remains of the third layer 24—which are, in fact, cylindrical ring-like or box-like structures if viewed from a top elevation.

Figure 6:
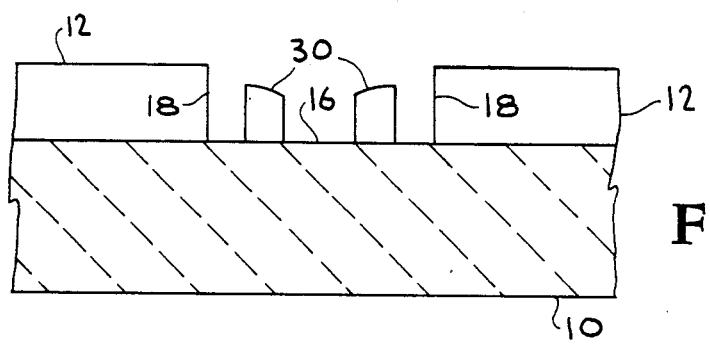

In the next step, shown in completion in FIG. 6, the nitride filaments 28 have been etched away using a selective etch. Hot phosphoric acid is one chemical which will etch away the nitride 28 at a much faster rate than the oxide layer 12 and the pillars 30. See, "The Etching of Silicon Nitride in Phosphoric Acid with Silicon Dioxide as a Mask," by Gelder and Hauser, *J. Electrochem. Society: Solid State Science*, Aug. 1967, Vol. 114, No. 8, pp. 869–872. There now exists on substrate surface 16 a complex oxide mask which can be used for groove etching of the substrate 10.

It is important to note that this mask has defined features which are sub-lithographic in size. The precise sizes of the mask features can be controlled by controlling the exact thicknesses of the layers formed and etched in the previous steps of the process of the invention. Again, remember that the Figures herein represent only one isolated element of the mask; thousands of such sub-lithographic mask definitions may have been formed on the substrate 10.

Figure 7:
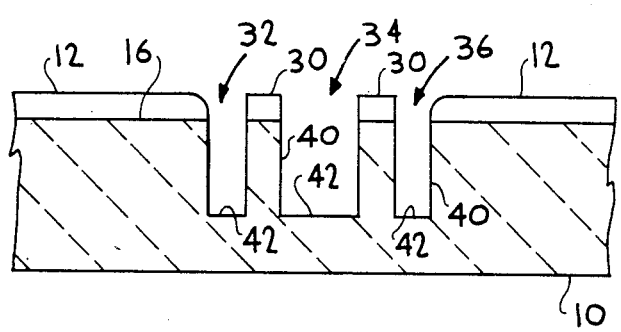

As shown in FIG. 7, using this mask, grooves 32, 34, 36 are etched into the silicon substrate 10 to the desired depth. As the etching process proceeds, the oxide mask is also etched at a rate about one-fifth the rate of etch of the silicon. Therefore, as mentioned above, the height of the oxide mask (the thickness of the deposited layers used to form it) is determined by the required groove depth. In practice, for example, a 4-micron-deep groove can be etched out of the substrate 10 using a 1-micron-thick mask.

After the formation of the grooves 32, 34, 36, the remains 12, 30 of the oxide mask are removed.

Figure 8:
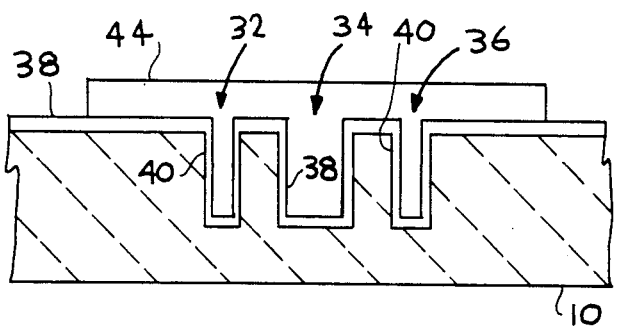

Referring now to FIG. 8, a thin capacitor insulator layer 38 is conformally formed, such as by thermal oxide growth, on the substrate surface 16 and on the groove sidewalls 40 and bottoms 42. This dielectric layer 38 should have a thickness of approximately 150 Angstroms; a range of approximately 60 to 300 will suffice to form a proper integrated circuit capacitor device. Then, a conductive capacitor plate 44 is formed, such as by CVD of polysilicon on said layer 38 so as to fill the grooves 32, 34, 36 and to superpose a surrounding region of the substrate 10.

Hence, the method has produced a multiple groove capacitor which can be coupled to other circuit components, such as a transistor to form a DRAM cell.

If a 1-micron-square capacitor is made with prior art methods of groove capacitor formation, the groove would have to be approximately 6.3 microns deep to achieve a 60 fF capacitor having a 150 Angstrom oxide (considered the standard for highly stable DRAM operation). With the approach taught by the present invention, the depth need only be 3.5 microns using a 150 Angstrom dielectric layer to get the same capacitance.

By proper selection of the groove widths, the structure can be made such that a relatively thin polysilicon capacitor plate will completely fill up the grooves without any need for a second polysilicon deposition and planarization etch-back step.

Figure 9:
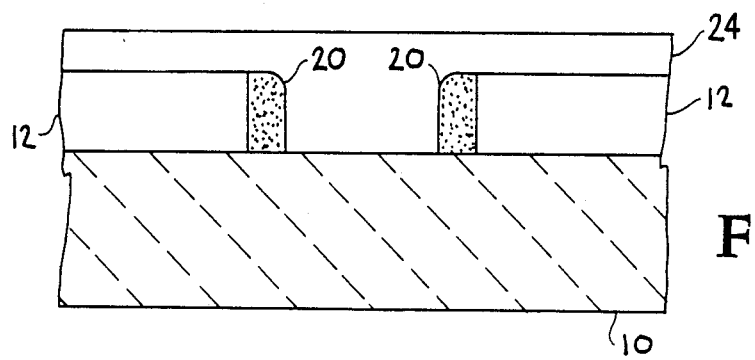
FIG. 9 is an alternative embodiment step to that shown in FIG. 4.
Figure 10:
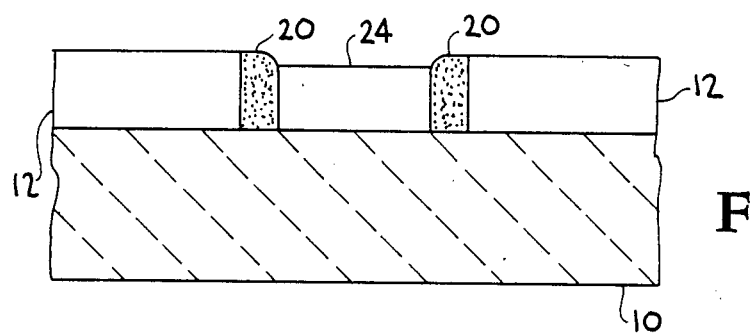
FIG. 10 is an alternative embodiment following step to that shown in FIG. 9 (corresponding to the step completion shown in FIG. 5)
Figure 11:
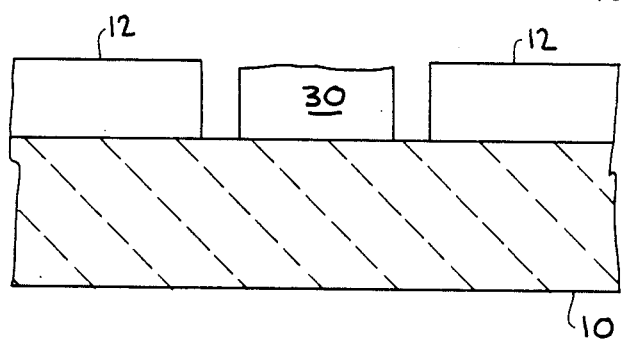
FIG. 11 is an alternative embodiment following step to that shown in FIG. 10 (corresponding to the step completion shown in FIG. 6).

Note carefully that the pillar formation steps can be repeated to create additional rings of the oxide mask (which will add two more sidewalls for each ring so created) where charge can be stored. Also, by increasing the thickness of the second oxide 24, the center groove 34 can be eliminated if so desired. This alternative is demonstrated in FIGS. 9–11 and results in a two-groove capacitor rather than the three-groove embodiment shown in FIG. 8.

Another alternative geometry can be created by substituting polysilicon for the nitride. In such a process, the outer groove will be shallower than the central groove by the thickness of the polysilicon that had to be etched before the substrate silicon started to be etched.

An important advantage of the process of the present invention is the ability to create a mask which has sublithographic dimensions. Hence, the creation of an array is possible which conventional photomasking would not allow.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in the art. It is possible that the invention may be practiced in other technologies, such as with bipolar or other MOS processes. Similarly, the process steps described may be performed in a different order to achieve the same result. The embodiment was chosen and described in order to best explain the principles of the invention and its practical application, to thereby enable others skilled in the art to best understand the invention for various embodiments and with various modifications as are suited to the particular use contemplated. It is intended that the scope of the invention be defined by the claims appended hereto and their equivalents.

What is claimed is:

1. An improved method of fabricating a multiply-grooved capacitor in an integrated circuit substrate, characterized by the steps of:
    forming a layer of masking material on said substrate;
    forming at least one aperture in said masking layer;
    forming at least one pillar of masking material in said aperture;
    forming grooves in said substrate using said masking material to pattern said grooves;
    removing said masking material; and
    forming a capacitor means on said substrate by conformally forming a thin layer of insulator material on said grooved substrate and by forming a layer of conductive material on said thin layer to fill said grooves.

2. The method as set forth in claim 1, wherein said substrate comprises crystalline silicon, said step of forming said first layer further comprises:
    forming said first layer of silicon dioxide.

3. The method as set forth in claim 2, wherein said step of forming said first layer of silicon dioxide further comprises:
    forming said layer to a thickness in the range of approximately one to four microns.

4. The method as set forth in claim 3, wherein said step of forming said second layer further comprises:
    conformally depositing a layer of silicon nitride.

5. The method as set forth in claim 4, wherein said step of depositing said silicon nitride further comprises:
    depositing said silicon nitride to a thickness in the range of approximtely 500 to 8000 Angstroms.

6. The method as set forth in claim 4, wherein said step of forming said second layer further comprises:
    anisotropically etching said silicon nitride layer to leave said nitride only on the side walls of said aperture.

7. The method as set forth in claim 6, wherein said step of forming said third layer further comprises:
    conformally depositing a second layer of silicon dioxide.

8. The method as set forth in claim 7, wherein said step of forming said third layer further comprises:
    anisotropically etching said second silicon dioxide layer to expose the upper surface of said nitride layer.

9. The method as set forth in claim 8, wherein said step of etching said second silicon dioxide layer further comprises:
    etching said layer to also expose the upper surface of said substrate lying between said conformal deposits of said second silicon dioxide layer on said silicon nitride.

10. The method as set forth in claim 9, wherein said step of depositing further comprises:
    depositing said second layer of silicon dioxide to a thickness in the range of approximately 500 to 8000 Angstroms.

11. The method as set forth in claim 10, wherein said step of removing said second layer further comprises:
    selectively etching said silicon nitride without substantially affecting said silicon dioxide layers.

12. The method as set forth in claim 11, wherein said step of forming grooves further comprises:
    etching grooves into said substrate;
    using said mask to prevent the formation of grooves in said substrate in the regions of the substrate underlying said mask.

13. The method as set forth in claim 12, wherein said step of forming said capacitor means further comprises:
    conformally forming a thin layer of silicon dioxide on said substrate and in said grooves.

14. The method as set forth in claim 13, wherein said step of forming said capacitor means further comprises;
    forming a layer of polysilicon material on said thin layer to fill said grooves.

15. The method as set forth in claim 14, further comprising:
    forming a plurality of said capacitor means in said substrate.

16. The method of fabricating a capacitor as set forth in claim 1, further comprising;
    forming a plurality of said pillars in said aperture.

17. The method of fabricating a capacitor as set forth in claim 16, wherein the depth of said grooves is determined by the height of said mask on said substrate and the rate of formation of said grooves.

18. A method of fabricating a dynamic random access memory (DRAM) bit storage capacitor in a silicon substrate, having a substantially planar surface, comprising:
- forming a first layer of silicon dioxide on said substrate surface;
- forming at least one aperture, having walls substantially perpendicular to said surface, in said first layer of silicon dioxide;
- conformally forming a layer of silicon nitride on said first silicon dioxide layer;
- anistropically etching said silicon nitride layer to leave said nitride layer on said walls of said aperture;
- forming a second layer of silicon dioxide on said first silicon dioxide layer and in said aperture;
- anisotropically etching said second silicon dioxide layer to expose the top of said nitride layer;
- selectively etching said silicon nitride from said substrate without substantially affecting said silicon dioxide layers, whereby at least one pillar of said silicon dioxide is left in said aperture;
- etching said silicon substrate to form grooves of a desired depth in said substrate;
- conformally forming a thin layer of silicon dioxide on said substrate and in said grooves; and
- depositing a layer of polysilicon material on said thin layer to fill said grooves.

* * * * *